(12) United States Patent
Wang et al.

(10) Patent No.: US 7,425,468 B2
(45) Date of Patent: Sep. 16, 2008

(54) METHOD FOR MAKING FLIP CHIP ON LEADFRAME PACKAGE

(75) Inventors: Meng-Jen Wang, Kaohsiung (TW); Chien Liu, Kaohsiung (TW); Tsan-Sheng Huang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 11/636,995

(22) Filed: Dec. 12, 2006

(65) Prior Publication Data

US 2007/0172981 A1 Jul. 26, 2007

(30) Foreign Application Priority Data

Jan. 20, 2006 (TW) ............................... 95102294 A

(51) Int. Cl.
*H01L 21/00* (2006.01)
*H01L 21/44* (2006.01)

(52) U.S. Cl. ...................... 438/108; 438/613
(58) Field of Classification Search ................. 438/613
See application file for complete search history.

(56) References Cited

U.S. PATENT DOCUMENTS

| 5,612,573 | A | 3/1997 | Lewis et al. |
| 6,175,157 | B1 * | 1/2001 | Morifuji ................ 257/777 |
| 6,429,113 | B1 | 8/2002 | Lewis et al. |
| 6,798,667 | B2 * | 9/2004 | Chan ..................... 361/767 |
| 2001/0008310 | A1 * | 7/2001 | Sakuyama et al. ........ 257/737 |
| 2001/0019173 | A1 * | 9/2001 | Taguchi et al. ........... 257/737 |
| 2004/0124540 | A1 * | 7/2004 | Chen et al. ............... 257/777 |
| 2005/0233571 | A1 * | 10/2005 | Tao et al. ................. 438/614 |
| 2006/0068521 | A1 * | 3/2006 | Shi et al. ................. 438/108 |
| 2006/0076679 | A1 * | 4/2006 | Batchelor et al. ......... 257/737 |
| 2007/0035019 | A1 * | 2/2007 | Carney et al. ............ 257/734 |

FOREIGN PATENT DOCUMENTS

TW I236110 7/2005

* cited by examiner

*Primary Examiner*—Hsien Ming Lee
*Assistant Examiner*—Kevin A Parendo
(74) *Attorney, Agent, or Firm*—Volentine & Whitt, P.L.L.C.

(57) ABSTRACT

A flip chip on leadframe package and manufacturing method includes providing a leadframe having a plurality of inner leads; providing a chip having an active surface; forming a plurality of first bumps and at least one second bump on the active surface, the material of the first bumps is the same as the second bump, and the height of the second bump is lower than the first bumps; dipping the top of the first bumps in a flux, so that the second bump is not dipped with the flux; contacting the first bumps to the corresponding inner leads; proceeding with a reflow so that the first bumps are melted and connected to the corresponding inner leads, and the second bump is connected to the corresponding inner lead without being melted, to maintain a gap between the chip and the inner leads to prevent collapse of the first bumps.

13 Claims, 10 Drawing Sheets

METHOD FOR MAKING FLIP CHIP ON LEADFRAME PACKAGE

BACKGROUND OF THE INVENTION

1. Field of the Invention

The invention relates to a chip on lead package and a method for making the same, particularly to a flip chip on leadframe package and the method of making the same.

2. Description of the Related Art

FIGS. 1 to 6 show a conventional method for making a flip chip on leadframe package. Firstly, referring to FIG. 1, a leadframe 10 having a plurality of inner leads 11 is provided. Each inner lead 11 has a first surface 111 and a second surface 112. Referring to FIG. 2, a chip 12 having an active surface 121 is provided. A plurality of bumps 13 are formed on the active surface 121 of the chip 12, wherein each bump 13 has substantially the same volume and height. Referring to FIG. 3, the top of the bumps 13 are dipped in a flux 14 so that the flux 14 attaches to the bumps 13. Referring to FIG. 4, the bumps 13 contact the first surface 111 of the corresponding inner leads 11. Referring to FIG. 5, a reflow step proceeds so that the bumps 13 are melted and connected to the first surface 111 of the inner leads 11. Finally, referring to FIG. 6, a molding material 15 is used to encapsulate the first surface 111 of the inner leads 11, the chip 12, and the bumps 13 to form a flip chip on leadframe package 1.

The conventional method has the following shortcomings. In FIG. 5, the bumps 13 are melted so that the bumps 13 cannot support the chip 12 when reflowing. Therefore, the gap between the active surface 121 of the chip 12 and the first surface 111 of the inner leads 11 cannot be controlled with assurance, so that the chip 12 collapses easily to cause damage to the bumps 13, and the flip chip bonding is not good.

Consequently, there is an existing need for providing a flip chip on leadframe package and a method for making the same to solve the above-mentioned problems.

SUMMARY OF THE INVENTION

An objective of the present invention is to provide a flip chip bonding method. A second bump is formed on an active surface of a chip, and the second bump is disposed outside the first bumps, wherein the material of the first bumps are the same as that of the second bump. The height of the second bump is lower than that of the first bumps so that the second bump is not dipped with the flux. Therefore, the second bump maintains the original shape so as to maintain a gap between the chip and the carrier when proceeding with a reflow step. The first bumps will not collapse so that the yield of the flip chip bonding is raised.

Another objective of the present invention is to provide a method for making a flip chip on leadframe package. The method comprises the following steps of:

(a) providing a leadframe having a plurality of inner leads;

(b) providing a chip having an active surface;

(c) forming a plurality of first bumps and at least one second bump on the active surface of the chip, wherein the material of the first bumps is same as that of the second bump, and the height of the second bump is lower than that of the first bumps;

(d) dipping the top of the bumps in a flux so that the first bumps are dipped with the flux, and the second bump is not dipped with the flux;

(e) contacting the first bumps to the corresponding inner leads; and (f) proceeding with a reflow step so that the first bumps are melted and connected to the corresponding inner leads, and the second bump is connected to the corresponding inner lead without being melted so as to maintain the gap between the chip and the inner leads.

Again, another objective of the present invention is to provide a flip chip on leadframe package. The flip chip on leadframe package comprises a leadframe, a chip and a molding material. The leadframe has a plurality of inner leads, and each inner lead has a first surface and a second surface. The chip has an active surface, and the active surface has a plurality of first bumps and at least one second bump. The first bumps contact the first surface of the corresponding inner leads. The material of the first bumps is the same as that of the second bump. The second bump contacts the first surface of the inner lead so as to maintain the gap between the active surface of the chip and the first surface of the inner leads. The molding material is used to encapsulate the first surface of the inner leads, the chip, the first bumps and the second bump.

DETAILED DESCRIPTION OF THE INVENTION

Figure 1:
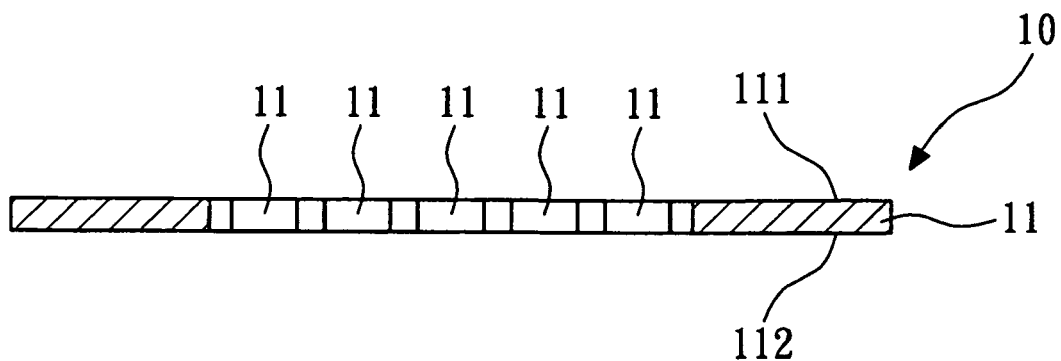
FIGS. 1 to 6 show a conventional method for making a flip chip on leadframe package.
Figure 2:
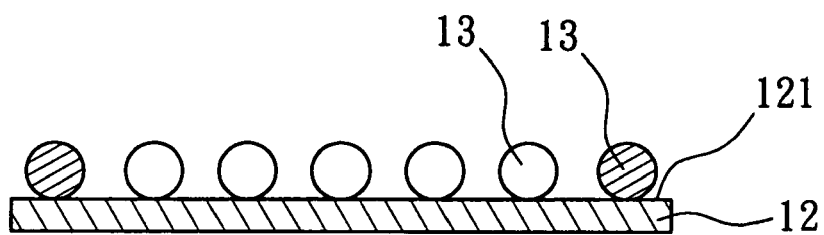
Figure 3:
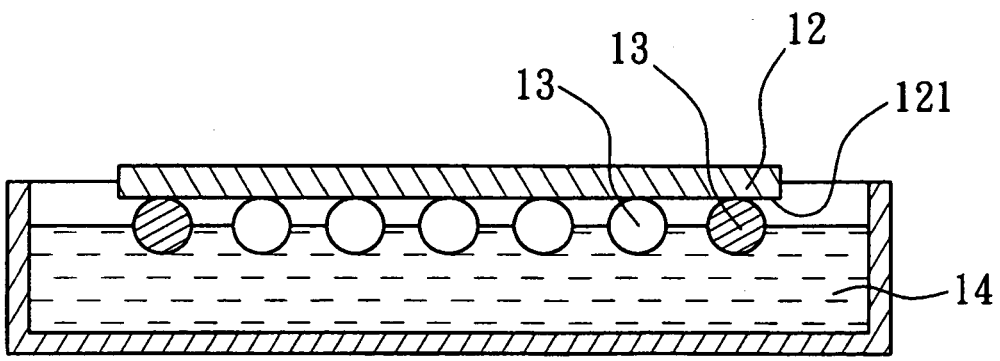
Figure 4:
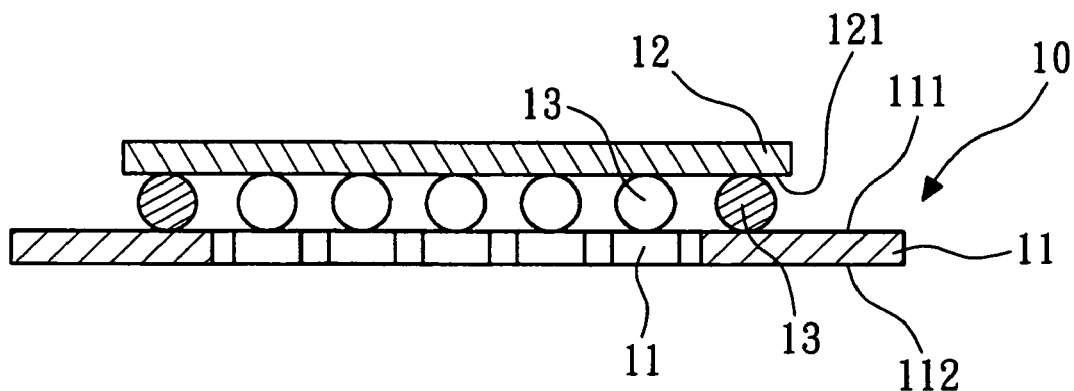
Figure 5:
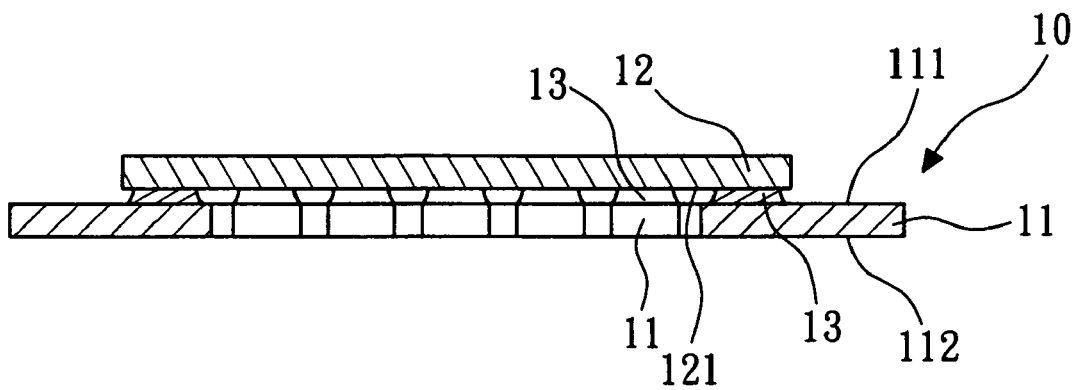
Figure 6:
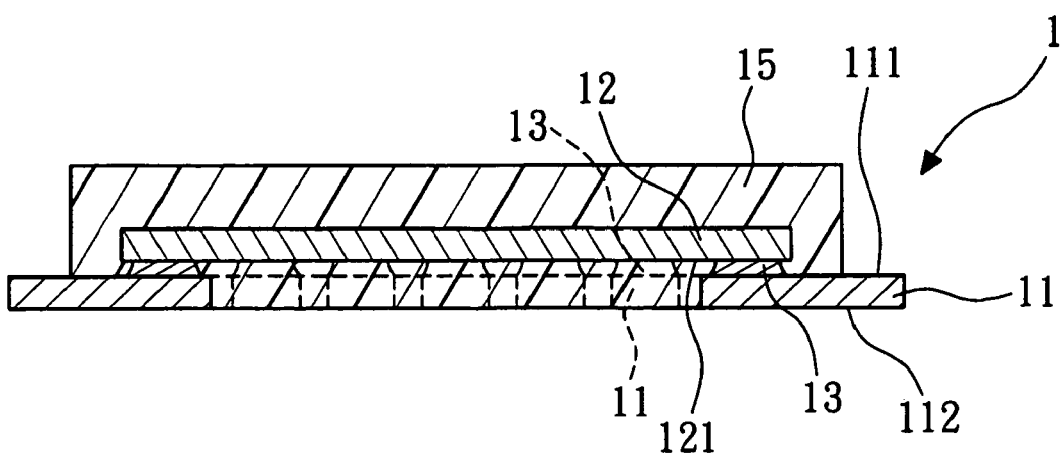
Figure 7:
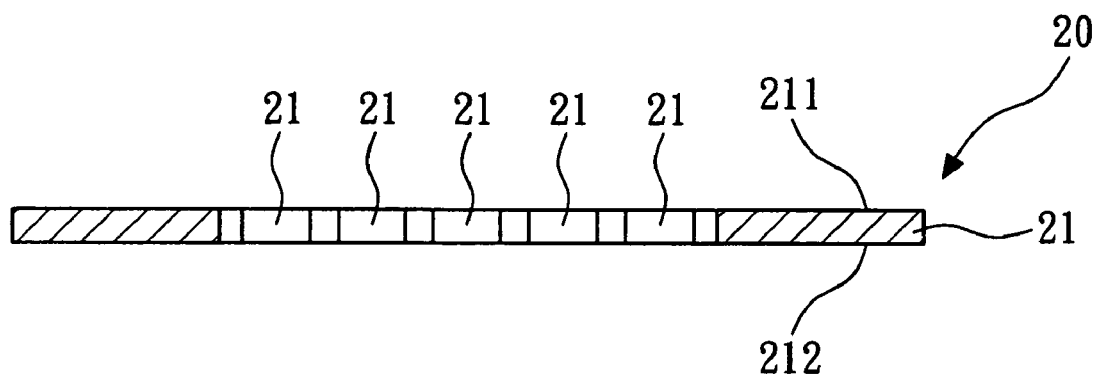
FIGS. 7 to 16 show a method for making a flip chip on leadframe package according to the present invention.
Figure 8:
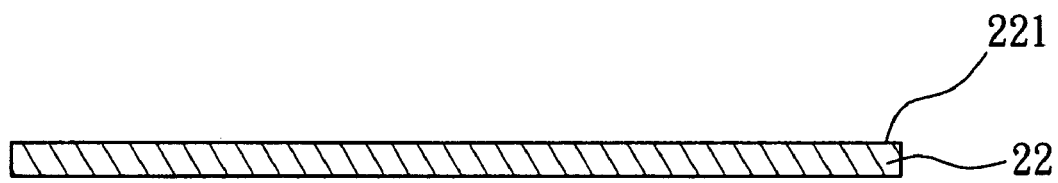
Figure 9:
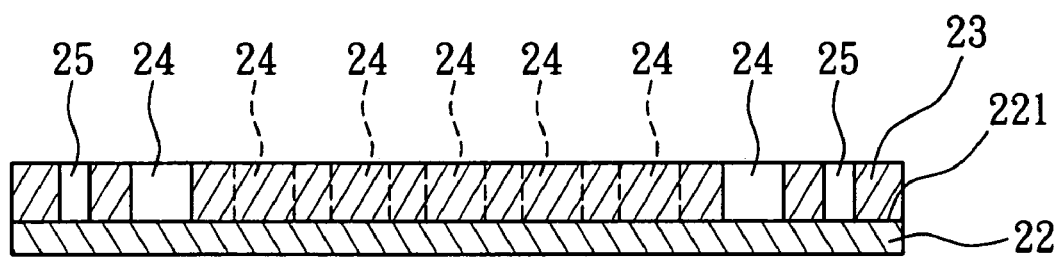
Figure 10:
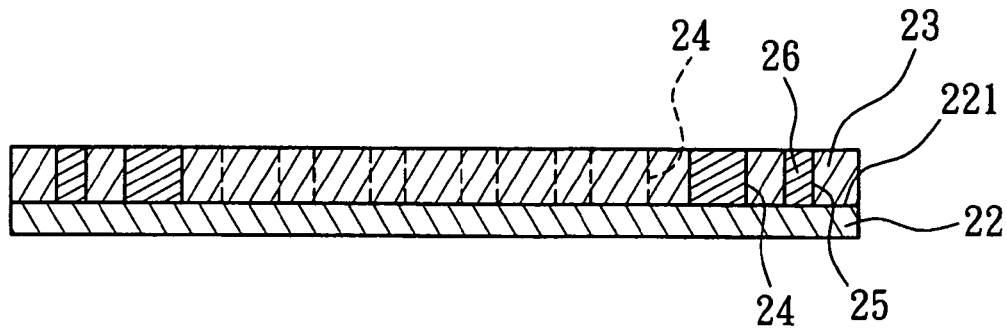
Figure 11:
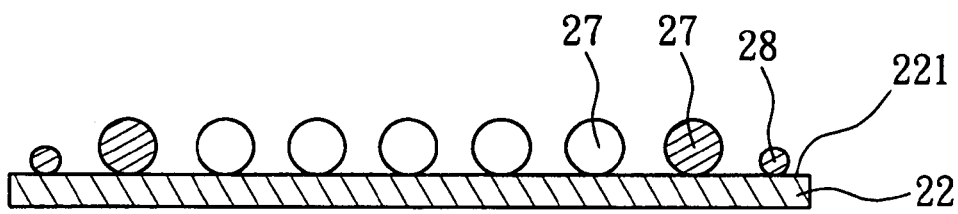

FIGS. 7 to 16 show a method for making a flip chip on leadframe package according to the present invention. Firstly, referring to FIG. 7, a leadframe 20 having a plurality of inner leads 21 is provided. Each inner lead 21 has a first surface 211 and a second surface 212. Referring to FIG. 8, a chip 22 having an active surface 221 is provided. Referring to FIG. 9, a photo resist 23 is formed on the active surface 221 of the chip 22. A plurality of first openings 24 and at least one second opening 25 are formed on the photo resist 23, wherein the area of the first openings 24 is larger than the area of the second opening 25. Referring to FIG. 10, a metal 26 is filled into the first openings 24 and the second opening 25, i.e. the first openings 24 and the second opening 25 are filled with the same metal material. Referring to FIG. 11, the photo resist 23 is removed. A reflow step then proceeds so that the metal 26 in the first openings 24 form a plurality of first bumps 27, and the metal 26 in the second opening 25 forms a second bump 28, wherein the height of the second bump 28 is lower than that of the first bumps 27. The material of the second bump 28 is the same as that of the first bumps 27, i.e. the first bumps 27 and the second bump 28 have the same melting point. In the embodiment, the second bump 28 is a dummy bump.

Figure 12:
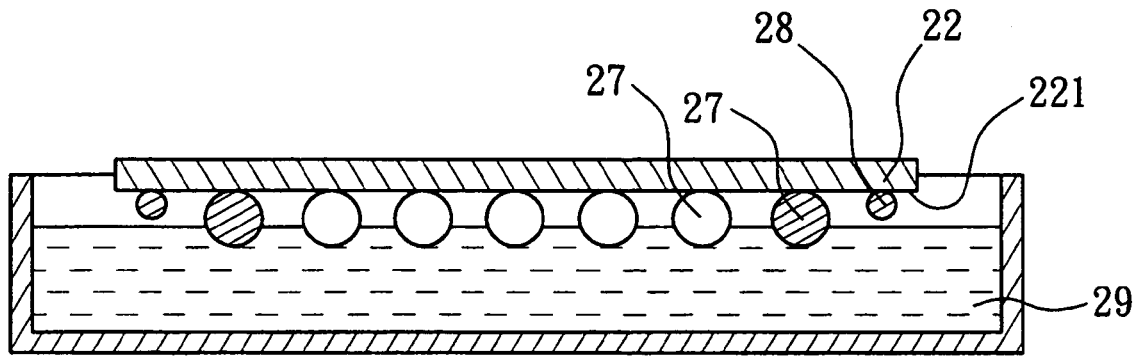
Figure 13:
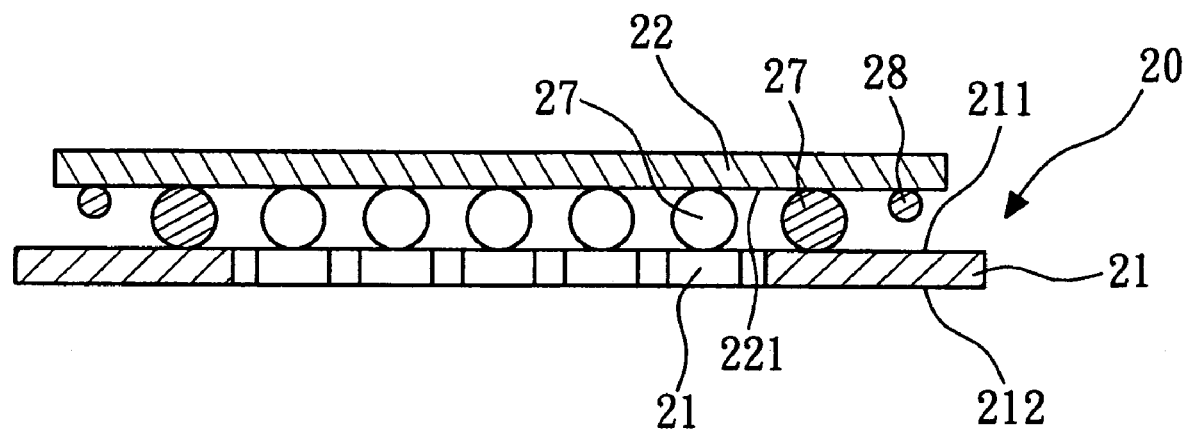

Referring to FIG. 12, the top of the first bumps 27 are dipped in a flux 29, at this time, the depth of the first bumps 27 dipping in the flux 29 must be controlled, so that the first bumps 27 are dipped with the flux 29, and the second bump 28 is not dipped with the flux 29. Referring to FIG. 13, the first bumps 27 contact the first surface 211 of the corresponding inner leads 21. Since the second bump 28 has a lower height, the second bump 28 does not contact the first surface 211 of the inner leads 21.

Figure 14:
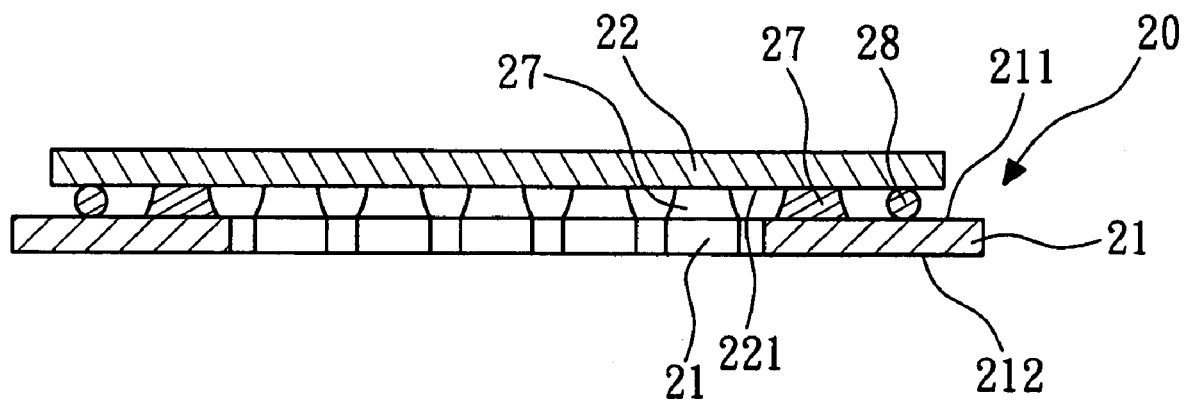

Referring to FIG. 14, a reflow step then proceeds so that the first bumps 27 are melted and connected to the first surface 211 of the inner leads 21. In the embodiment, oxidation layers (not shown) inside the first bumps 27 are removed by utilizing the flux 29, so that the first bumps 27 can be totally melted and are eutecticly bonded with the first surface 211 of the inner leads 21. Since the second bump 28 is not dipped with the flux 29, the oxidation layer (not shown) on the surface of the second bump 28 cannot be removed. The second bump 28 is covered by the oxidation layer in the reflow step, so that the second bump 28 cannot be totally melted to the inner leads 21 but contacts the first surface 211 of the inner leads 21. In the reflow step, the first bumps 27 are melted so that the chip 22 will sink down slightly till the bottom of the second bump 28 contacts the first surface 211 of the inner leads 21. The joint type between the second bump 28 and the first surface 211 of the inner leads 21 is cold joint. In addition, the second bump 28 cannot be totally melted when reflowing so that the second bump 28 maintains the original shape so as to maintain a gap between the active surface 221 of the chip 22 and the first surface 211 of the inner leads 21. Therefore, the first bumps 27 will not collapse so that the yield of the flip chip bonding is raised. In the embodiment, after reflowing, the first bumps 27 are substantially trapezoid-shaped, and the second bump 28 is substantially round-shaped.

Figure 15:
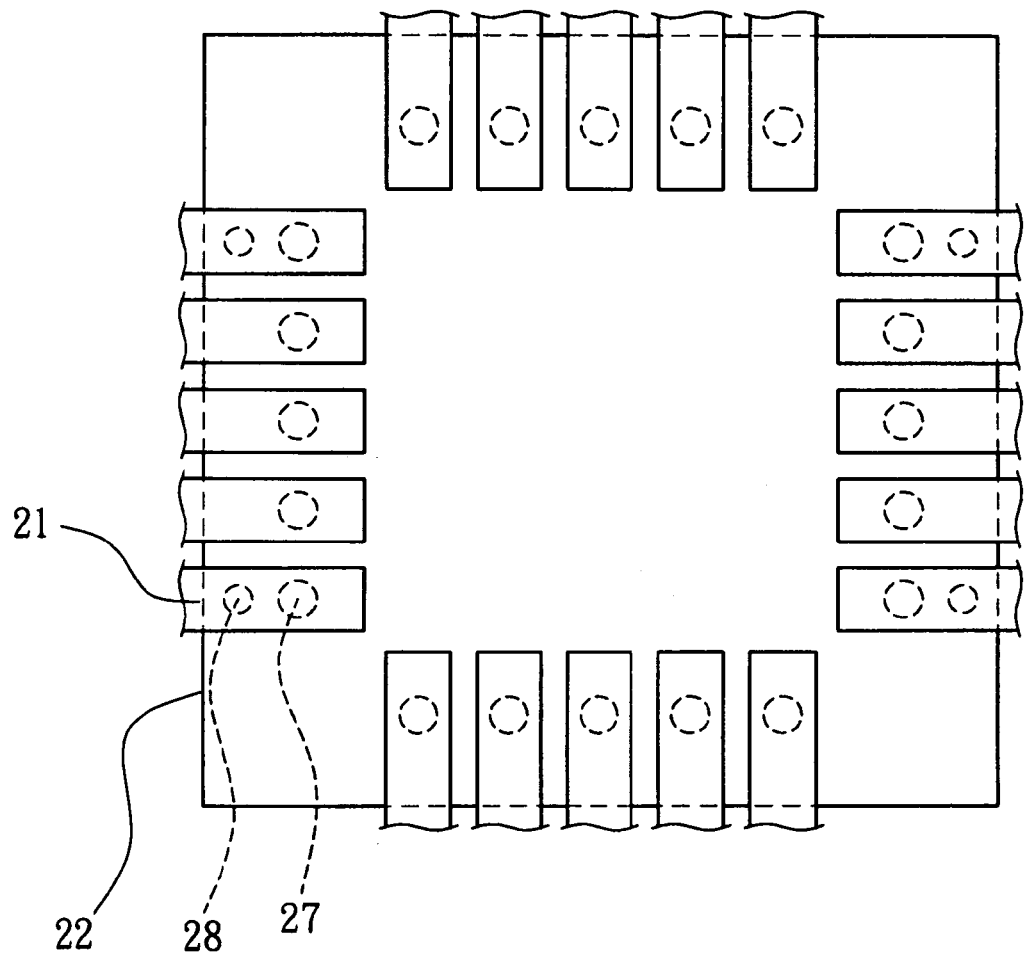

Referring to FIG. 15, it shows the bottom view of the FIG. 14. In the embodiment, it can be seen that the second bump 28 and a first bump 27 contact the same inner lead 21, and the second bump 28 is disposed at four corners. However, the number of the second bump 28 and the position of the second bump 28 are not limited to those in FIG. 15, they may be various types for various applications.

Figure 16:
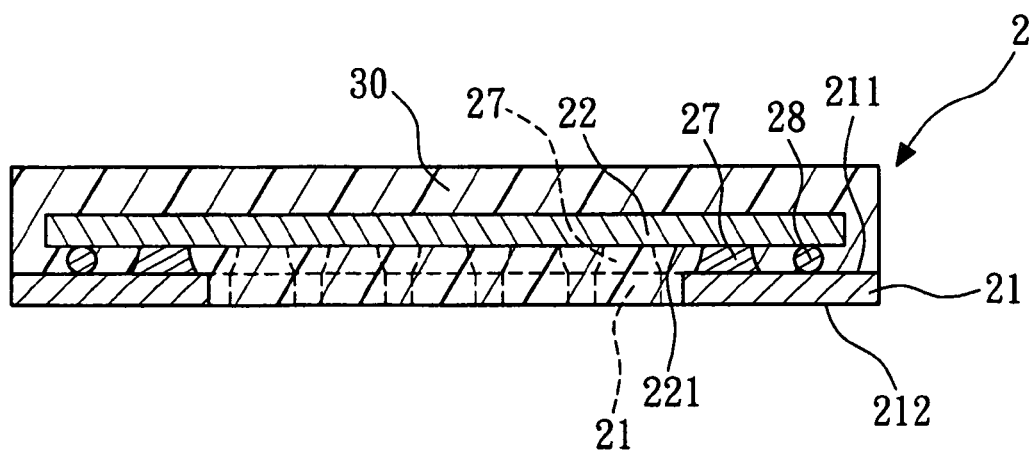

Finally, referring to FIG. 16, a molding material 30 is used to encapsulate the first surface 211 of the inner leads 21, the chip 22, the first bumps 27 and the second bump 28 to form a flip chip on leadframe package 2.

Referring to FIG. 16 again, it shows a sectional view of the flip chip on leadframe package according to the present invention. The flip chip on leadframe package 2 comprises a leadframe 20, a chip 22 and a molding material 30. The leadframe 20 has a plurality of inner leads 21, and each inner lead 21 has a first surface 211 and a second surface 212. The chip 22 has an active surface 221, and the active surface 221 has a plurality of first bumps 27 and at least one second bump 28. The first bumps 27 contact the first surface 211 of the corresponding inner leads 21. In the embodiment, the first bumps 27 are eutecticly bonded with the first surface 211 of the inner leads 21 and are substantially trapezoid-shaped. The material of the second bump 28 is the same as that of the first bumps 27. The second bump 28 contacts the first surface 211 of the inner lead 21 so as to maintain the gap between the active surface 221 of the chip 22 and the first surface 211 of the inner leads 21. In the embodiment, the second bump 28 is round-shaped and has an oxidation layer on its surface. The volume of the first bumps 27 is larger than that of the second bump 28, and the area for the first bumps 27 contacting the inner leads 211 is larger than that for the second bump 28 contacting the first surface 211 of the inner lead 21. In the embodiment, the second bump 28 and one of the first bumps 27 contact the same inner lead 21. The molding material 30 is used to encapsulate the first surface 211 of the inner leads 21, the chip 22, the first bumps 27 and the second bump 28.

Figure 17:
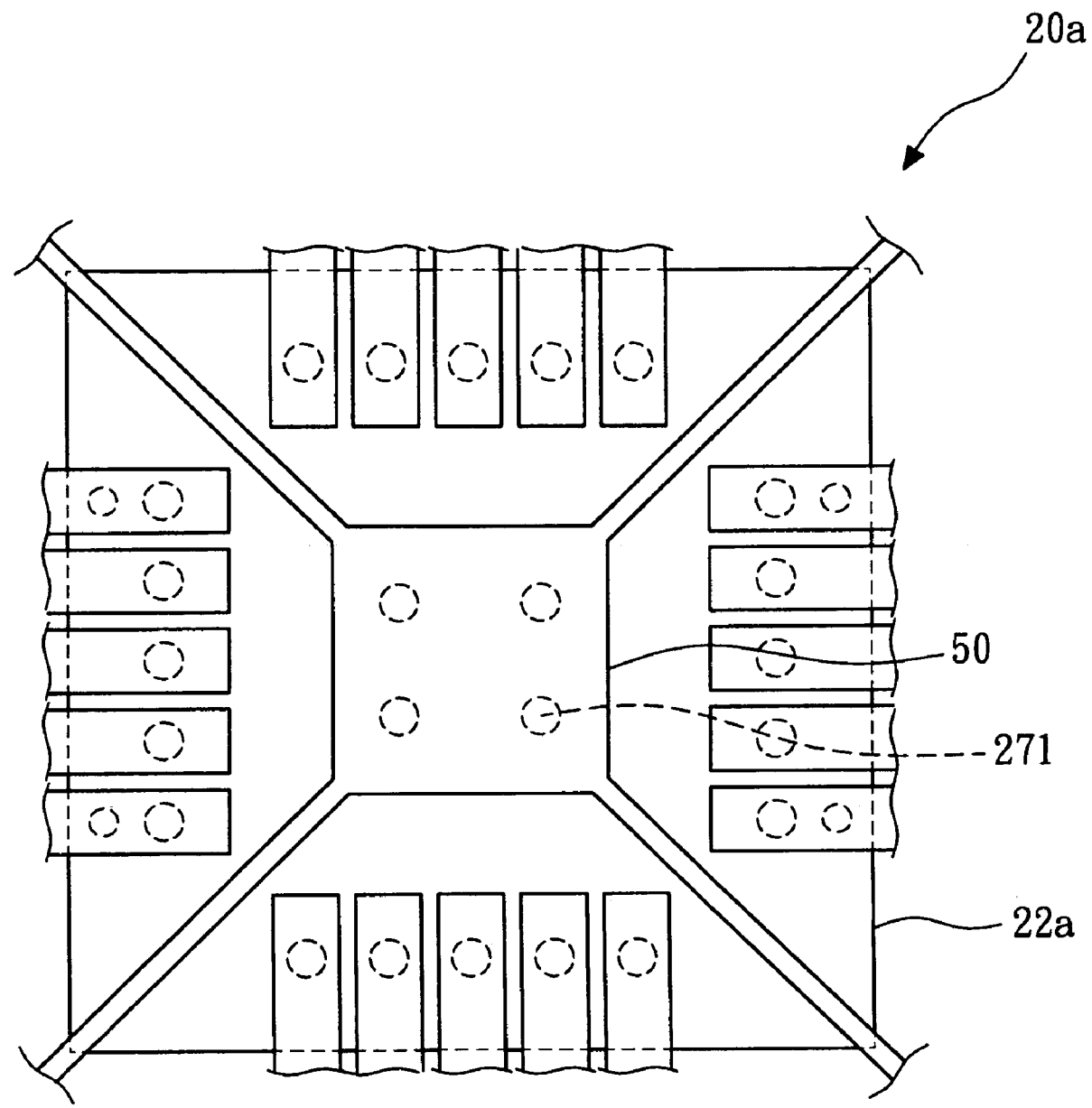
FIG. 17 shows another type of leadframe according to the present invention.
Figure 18:
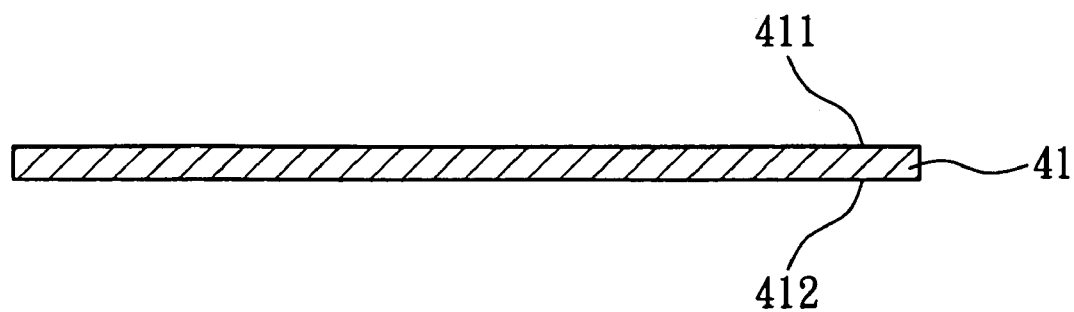
FIG. 18 to 25 show a flip chip bonding method according to the present invention.

FIG. 17 shows another type of leadframe. The difference between the leadframe 20a and the leadframe 20 is that in FIG. 17 a thermal pad 50 is disposed under the leadframe 20a so as to connect a plurality of third bumps 271 forming on the chip 22a. The third bumps 271 may be thermal bumps used to conduct the heat producing by the chip 22a to the thermal pad 50, and the heat then is conducted outside; or the third bumps 271 may be ground bumps used to transmit the ground signal to the thermal pad 50.

Figure 19:
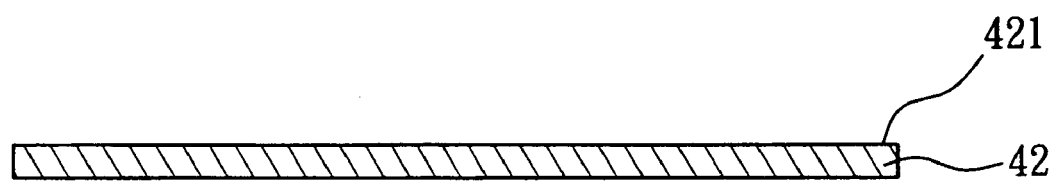
Figure 20:
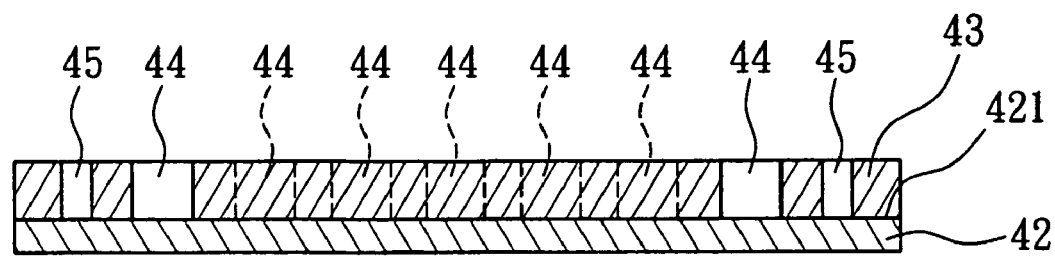
Figure 21:
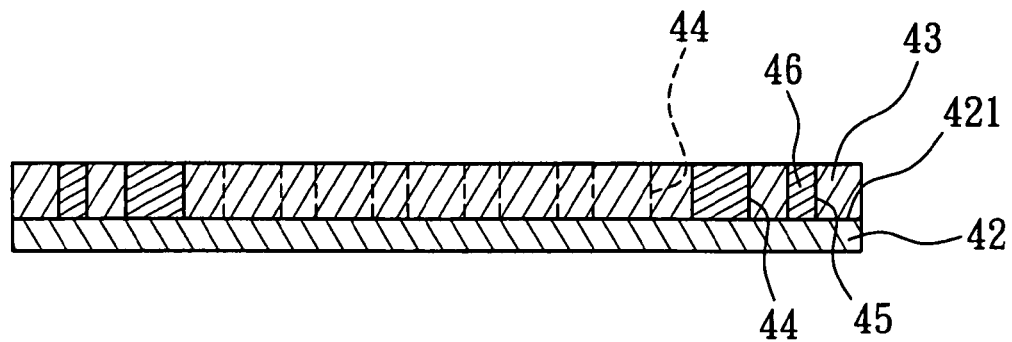
Figure 22:
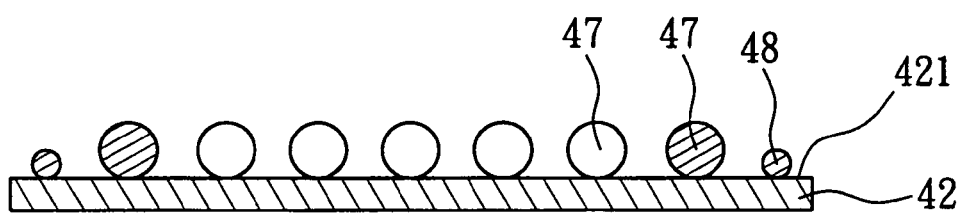

Further, the present invention relates to a flip chip bonding method. FIGS. 18 to 25 show the flip chip bonding method according to the invention. Firstly, referring to FIG. 18, a carrier 41 (for example a substrate or a leadframe) having a first surface 411 and a second surface 412 is provided. Referring to FIG. 19, a chip 42 having an active surface 421 is provided. Referring to FIG. 20, a photo resist 43 is formed on the active surface 421 of the chip 42. A plurality of first openings 44 and at least one second opening 45 are formed on the photo resist 43, wherein the area of the first openings 44 is larger than the area of the second opening 45. Referring to FIG. 21, a metal 46 is filled into the first openings 44 and the second opening 45, i.e. the first openings 44 and the second opening 45 are filled with the same metal material. Referring to FIG. 22, the photo resist 43 is removed. A reflow step then proceeds so that the metal 46 in the first openings 44 form a plurality of first bumps 47, and the metal 46 in the second opening 45 forms a second bump 48, wherein the height of the second bump 48 is lower than that of the first bumps 47. The material of the second bump 48 is the same as that of the first bumps 47, i.e. the first bumps 47 and the second bump 48 have the same melting point. In the embodiment, the second bump 48 is a dummy bump.

Figure 23:
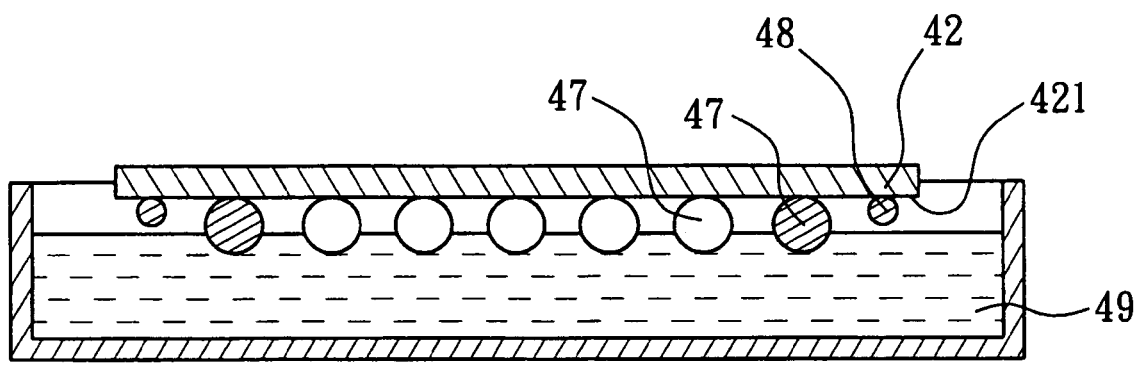
Figure 24:
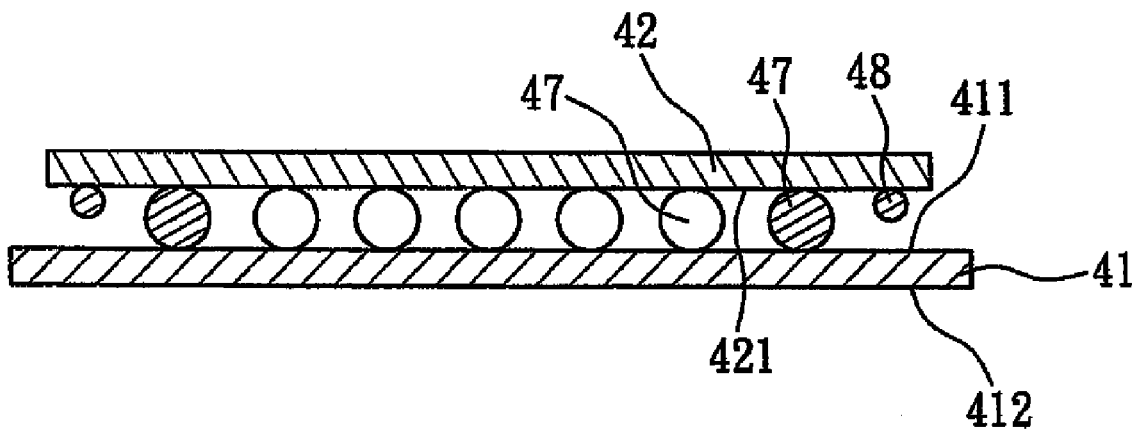
Figure 25:
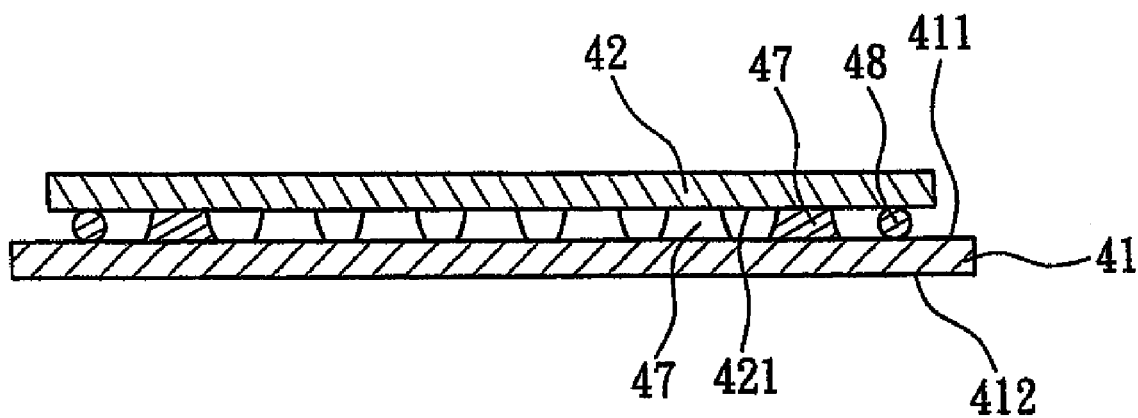

Referring to FIG. 23, the top of the first bumps 47 are dipped in a flux 49, at this time, the depth of the first bumps 47 dipping in the flux 49 must be controlled, so that the first bumps 47 are dipped with the flux 49, and the second bump 48 is not dipped with the flux 49. Referring to FIG. 24, the first bumps 47 contact the first surface 411 of the corresponding carrier 41. The second bump 48 has a lower height so that the second bump 48 does not contact the first surface 411 of the carrier 41. Referring to FIG. 25, a reflow step then proceeds so that the first bumps 47 are melted and connected to the first surface 411 of the carrier 41. In the embodiment, the first bumps 47 are eutecticly bonded with the first surface 411 of the carrier 41. Since the second bump 48 is not dipped with the flux 49, the second bump 48 is covered by an oxidation layer so that the second bump 48 cannot be totally melted. In the embodiment, the second bump 48 contacts the first surface 411 of the carrier 41. In the reflow step, the first bumps 47 are melted so that the chip 42 will sink down slightly till the bottom of the second bump 48 contacts the first surface 411 of the carrier 41. In addition, the second bump 48 cannot be totally melted when reflowing so that the second bump 48 maintains the original shape so as to maintain a gap between the active surface 421 of the chip 42 and the first surface 411 of the carrier 41. Therefore, the first bumps 47 will not collapse so that the yield of the flip chip bonding is raised.

While the embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications that maintain the spirit and scope of the present invention are within the scope as defined in the appended claims.

What is claimed is:

1. A method for making a flip chip on leadframe package, comprising the following steps of:
    (a) providing a leadframe having a plurality of inner leads;
    (b) providing a chip having an active surface;
    (c) forming a plurality of first bumps and at least one second bump on the active surface of the chip, wherein the material of the first bumps is the same as that of the second bump, and a height of the second bump is smaller than that of the first bumps;

(d) dipping tops of the first bumps in a flux so that the first bumps are dipped with the flux, and the second bump is not dipped with the flux;

(e) contacting the first bumps to corresponding inner leads; and (f) proceeding with a reflow step so that the first bumps are melted and connected to the corresponding inner leads, and the second bump is connected to the corresponding inner lead without being melted so as to maintain a gap between the active surface of the chip and the inner leads.

2. The method according to claim 1, further comprising a step of:

(g) forming a molding material to encapsulate the inner leads, the chip, the first bumps and the second bump after step (f).

3. The method according to claim 1, wherein the second bump and one of the first bumps contact the same inner lead in step (e).

4. The method according to claim 1, wherein the step (c) comprises the following steps of:

(c1) forming a photo resist on the active surface of the chip;

(c2) forming a plurality of first openings and at least one second opening on the photo resist, wherein an area of the first openings is larger than an area of the second opening;

(c3) filling a metal into the first openings and the second opening;

(c4) removing the photo resist; and (c5) proceeding with a reflow step so that the metal in the first openings form a plurality of the first bumps, and the metal in the second opening forms the second bump, wherein the height of the second bump is lower than that of the first bumps.

5. The method according to claim 1, wherein the second bump is a dummy bump in step (c).

6. The method according to claim 1, wherein the first bumps are eutecticly bonded with the leadframe, and the second bump contacts the leadframe in step (f).

7. A flip chip bonding method, comprising the following steps of:

(a) providing a carrier having a first surface and a second surface;

(b) providing a chip having an active surface;

(c) forming a plurality of first bumps and at least one second bump on the active surface of the chip, wherein a material of the first bumps is same as that of the second bump, and a height of the second bump is smaller than that of the first bumps;

(d) dipping tops of the first bumps in a flux so that the first bumps are dipped with the flux, and the second bump is not dipped with the flux;

(e) contacting the bumps to the first surface of the carrier; and (f) proceeding with a reflow step so that the first bumps are melted and connected to the first surface of the carrier, and the second bump is connected to the first surface of the carrier without being melted so as to maintain the gap between the active surface of the chip and the first surface of the carrier.

8. The method according to claim 7, further comprising a step of:

(g) forming a molding material to encapsulate the carrier, the chip, the first bumps and the second bump after step (f).

9. The method according to claim 7, wherein the step (c) comprises the following steps of:

(c1) forming a photo resist on the active surface of the chip;

(c2) forming a plurality of first openings and at least one second opening on the photo resist, wherein the area of the first openings is larger than the area of the second opening;

(c3) filling a metal into the first openings and the second opening;

(c4) removing the photo resist; and (c5) proceeding with a reflow step so that the metal in the first openings form a plurality of the first bumps, and the metal in the second opening forms the second bump, wherein the height of the second bump is lower than that of the first bumps.

10. The method according to claim 7, wherein the carrier is a substrate in step (a).

11. The method according to claim 7, wherein the carrier is a leadframe in step (a).

12. The method according to claim 7, wherein the second bump is a dummy bump in step (c).

13. The method according to claim 7, wherein the first bumps are eutecticly bonded with the carrier, and the second bump contacts the carrier in step (f).

* * * * *